United States Patent
Byun

(10) Patent No.: US 9,530,474 B2
(45) Date of Patent: Dec. 27, 2016

(54) SEMICONDUCTOR INTEGRATED CIRCUIT INCLUDING SEMICONDUCTOR MEMORY APPARATUS INCLUDING A PLURALITY OF BANKS

(71) Applicant: SK hynix Inc., Icheon-si, Gyeonggi-do (KR)

(72) Inventor: Hee Jin Byun, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/809,897

(22) Filed: Jul. 27, 2015

(65) Prior Publication Data
US 2015/0348604 A1    Dec. 3, 2015

Related U.S. Application Data

(62) Division of application No. 13/619,871, filed on Sep. 14, 2012, now Pat. No. 9,123,403.

(30) Foreign Application Priority Data

Feb. 7, 2012  (KR) .................. 10-2012-0012236

(51) Int. Cl.
| | | |
|---|---|---|
| G11C 7/22 | (2006.01) | |
| G11C 8/18 | (2006.01) | |
| G11C 8/04 | (2006.01) | |
| G11C 8/06 | (2006.01) | |
| G11C 8/12 | (2006.01) | |
| G11C 7/10 | (2006.01) | |

(52) U.S. Cl.
CPC .............. *G11C 7/222* (2013.01); *G11C 7/109* (2013.01); *G11C 7/1039* (2013.01); *G11C 7/1084* (2013.01); *G11C 7/1087* (2013.01); *G11C 7/1093* (2013.01); *G11C 7/22* (2013.01); *G11C 8/04* (2013.01); *G11C 8/06* (2013.01); *G11C 8/12* (2013.01); *G11C 8/18* (2013.01)

(58) Field of Classification Search
CPC ............ G11C 7/222; G11C 8/06; G11C 8/04; G11C 7/1039; G11C 7/1087; G11C 7/22; G11C 7/1084; G11C 7/1093; G11C 7/109; G11C 8/12; G11C 8/18
See application file for complete search history.

(56) References Cited

U.S. PATENT DOCUMENTS

| 7,466,623 B2* | 12/2008 | Jeong | G11C 7/1027 365/194 |
|---|---|---|---|
| 7,773,448 B2* | 8/2010 | Kim | G11C 8/04 365/230.03 |
| 7,872,940 B2* | 1/2011 | Kwean | G11C 29/1201 365/189.05 |
| 7,911,824 B2* | 3/2011 | Kawai | G11C 11/56 365/148 |

(Continued)

*Primary Examiner* — Vanthu Nguyen
(74) *Attorney, Agent, or Firm* — William Park & Associates Ltd.

(57) ABSTRACT

A semiconductor memory apparatus includes: a memory cell area including a plurality of banks each having a plurality of octet banks corresponding to a first group and a plurality of octet banks corresponding to a second group; and a control unit configured to generate a plurality of control signals to input a data signal to any one octet bank of the first group and any one octet bank of the second group with a predetermined margin.

12 Claims, 6 Drawing Sheets

(56) References Cited

U.S. PATENT DOCUMENTS

| | | | |
|---|---|---|---|
| 8,050,137 B2* | 11/2011 | Lee | G11C 7/1027 365/189.12 |
| 2007/0086260 A1* | 4/2007 | Sinclair | G06F 12/0246 365/230.03 |
| 2010/0157717 A1* | 6/2010 | Lee | G11C 7/1027 365/230.08 |

* cited by examiner

SEMICONDUCTOR INTEGRATED CIRCUIT INCLUDING SEMICONDUCTOR MEMORY APPARATUS INCLUDING A PLURALITY OF BANKS

CROSS-REFERENCES TO RELATED APPLICATION

The present application claims priority under 35 U.S.C. §119(a) to Korean application number 10-2012-0012236, filed on Feb. 7, 2012, in the Korean Intellectual Property Office, which is incorporated herein by reference in its entirety.

BACKGROUND

1. Technical Field

The present invention generally relates to a semiconductor integrated circuit, and more particularly, to a semiconductor memory apparatus having a SerDes structure and a semiconductor integrated circuit including the same.

2. Related Art

Recently, with the increase in operation speed of semiconductor memory apparatuses, the number of data processed at a time by each bank has increased. Accordingly, the number of data input/output lines connected to each bank has also increased. The increase in the number of data input/output lines may serve as a factor to increase a semiconductor memory chip area.

Accordingly, a SerDes data input/output structure has been proposed to prevent an increase in area of a semiconductor memory apparatus based on the increase in the number of data input/output lines.

In a general semiconductor memory apparatus, the SerDes data input/output structure refers to a structure in which one bank has eight octet banks and any one octet bank corresponding to a first group of data and any one octet bank corresponding to a second group of the data form a pair connected to one data input/output line.

Since the semiconductor memory apparatus having the SerDes structure loads two data into one data input/output line, the number of data input/output lines may be reduced to ½.

Accordingly, the semiconductor memory apparatus having the SerDes structure receives an internal command of a data signal to be inputted to two octet banks once per two clocks, while an existing semiconductor memory apparatus receives an internal command once per four clocks. According to the internal command, a data enable signal ENDIO for loading data into a data input/output line is also generated once per two clocks.

In such a general semiconductor memory apparatus, when a memory bank receives data from a data input/output line, the data is loaded into the data input/output line once per two clocks according to a CAS internal command. However, according to a bank input enable signal BWEN as a strobe signal, the memory bank receives data once per four clocks. Therefore, the data may not be inputted to the memory bank, or data of a first octet bank may not be received, but only data of a second octet bank may be received.

SUMMARY

A semiconductor memory apparatus capable of efficiently inputting data to banks in a SerDes structure and a semiconductor integrated circuit including the same are described herein.

In an embodiment, a semiconductor memory apparatus includes: a memory cell area including a plurality of banks each having a plurality of octet banks corresponding to a first group and a plurality of octet banks corresponding to a second group; and a control unit configured to generate a plurality of control signals to input a data signal to any one octet bank of the first group and any one octet bank of the second group with a predetermined margin.

In an embodiment, a semiconductor memory apparatus includes: a plurality of banks each having a plurality of octet banks which are sequentially arranged and form a pair to receive a data signal through one data input/output line, a signal receiving unit configured to receive a command signal and an address signal from outside; and a control unit configured to generate a plurality of control signals to control the data signal to be inputted to the respective octet banks forming a pair with a predetermined margin, using the command signal and the address signal which are received through the signal receiving unit.

In an embodiment, a semiconductor integrated circuit includes: a memory control apparatus configured to receive a data signal, a command signal, and an address signal from outside and control the data signal to be inputted or outputted; and a semiconductor memory apparatus configured to receive the data signal, the command signal, and the address signal from the memory control apparatus, shift the command signal and the address signal to have a predetermined margin in synchronization with the same clock, generate a plurality of control signals using the shifted command signal and address signal, and input the data signal to a corresponding bank according to control of the generated control signals.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a semiconductor integrated circuit including the same according to the present invention will be described below with reference to the accompanying drawings through various embodiments.

Figure 1:
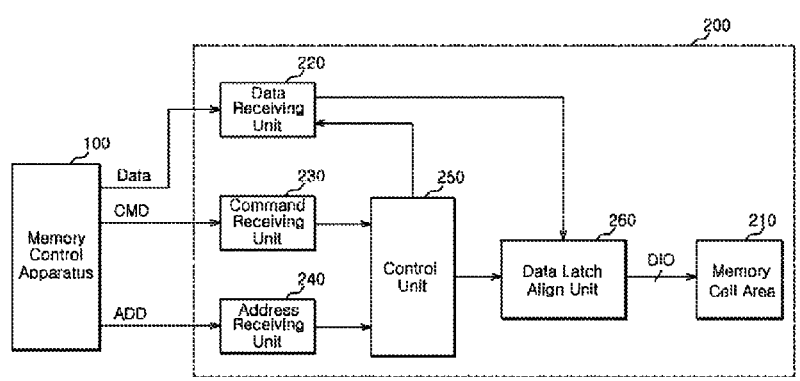
FIG. 1 is a diagram illustrating the configuration of a semiconductor integrated circuit according to an embodiment.
Figure 2:
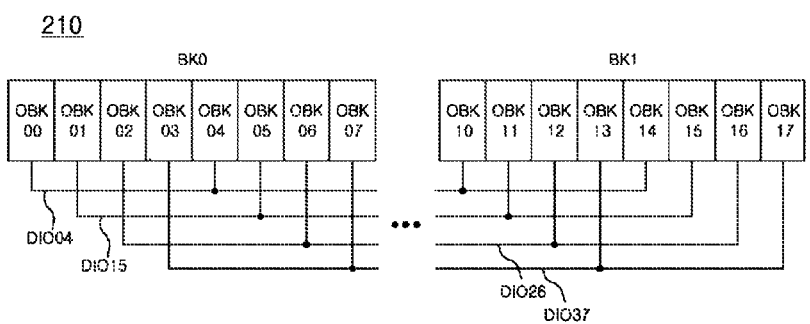
FIG. 2 is a diagram illustrating a bank structure of a memory cell area of a semiconductor memory apparatus according to an embodiment.

FIG. 1 is a diagram illustrating the configuration of a semiconductor integrated circuit according to an embodiment. FIG. 2 is a diagram illustrating a bank structure of a memory cell area of a semiconductor memory apparatus according to an embodiment.

Referring to FIG. 1, the semiconductor integrated circuit according to an embodiment may include a memory control apparatus 100 and a semiconductor memory apparatus 200.

The memory control apparatus 100 may be configured to receive a command signal CMD, an address signal ADD, and a data signal Data from the outside, for example, a host (not illustrated), and control data to be written into or read from the semiconductor memory apparatus 200.

The semiconductor memory apparatus 200 may include a memory cell area 210, a data receiving unit 220, a command receiving unit 230, an address receiving unit 240, a control unit 250, and a data latch/align unit 260. Data input/output lines may couple the data latch align unit 250 to the memory cell area 210.

The memory cell area 210 may include eight banks each having eight octet banks, and has a SerDes data input/output structure to reduce the number of data input/output lines. More specifically, referring to FIG. 2, a first bank BK0 of the memory cell area 210 may include octet banks OBK00 to OBK03 according to a first group and octet banks OBK04 to OBK07 corresponding to a second group and a second bank BK1 may include octet banks OKB10 to OBK13 according to a first group and octet banks OBK14 to OBK17 corresponding to a second group. The octet banks OBK00 and OBK04, the octet banks OBK01 and OBK05, the octet banks OBK02 and OBK06, and the octet banks OBK03 and OBK07 form pairs connected to data input/output lines DIO04, DIO15, DIO26, and DIO37, respectively, and the octet banks OBK10 and OBK14, the octet banks OBK11 and OBK15, the octet banks OBK12 and OBK16, and the octet banks OBK13 and OBK17 form pairs connected to the data input/output lines DIO04, DIO15, DIO26, and DIO37, respectively.

Here, the memory cell area 210 of the semiconductor memory apparatus 200 according to an embodiment has a structure in which the octet banks may be sequentially arranged. However, the memory cell area 210 of the semiconductor memory apparatus 200 may have a structure in which two octet banks sharing one data input/output line may be arranged next to each other. That is, the banks of the memory cell area 210 of FIG. 2 may be arranged in order of OBK00, OBK01, OBK02, OBK03, OBK04, OBK05, OBK06, and OBK07. However, when two octet banks sharing one data input/output line are arranged next to each other, the banks of the memory cell area 210 may be arranged in order of OBK00, OBK04, OBK01, OBK05, OBK02, OBK06, OBK03, and OBK07. In this case, the length of the data input/output line in a peri area may be reduced to the minimum.

The data receiving unit 220 may be configured to receive a data signal Data from the memory control apparatus 100, buffer the received data signal, and load the data signal into a data input/output line DIO when a control signal is inputted from the control unit 250.

The command receiving unit 230 may be configured to receive a command signal CMD from the memory control apparatus 100 and may output the received command signal to the control unit 250.

The address receiving unit 240 may be configured to receive an address signal ADD from the memory control apparatus 100 and may output the received address signal to the control unit 250.

The control unit 250 may be configured to synchronize the command signal CMD and the address signal ADD with the same clock signal, and generate a control signal for controlling data to be normally inputted to all of the banks in a SerDes structure such as the memory cell area 210. Here, the control signal may include a data enable signal ENDIO for loading the data signal Data received by the data receiving unit 220 into the data input/output line DIO at a difference of about two clocks (i.e. about two predetermined lengths of time or time periods), a first latch signal LATCH03 for latching a data signal to be inputted to the octet banks OBK00 to OBK03 of the first group, a second latch signal LATCH47 for latching a data signal to be inputted to the octet banks OBK04 to OBK07 of the second group, and an align signal ALIGN for aligning the data signals to the respective banks. At this time, the data enable signal ENDIO, the first latch signal LATCH03, the second latch signal LATCH47, and the align signal ALIGN are generated using the command signal and the address signal which may be outputted in synchronization with the same clock. Accordingly, the signals are generated at substantially the same time. The control unit 250 will be described in more detail with reference to FIGS. 3 to 7.

The data latch/align unit 260 may be configured to latch and align the data signals such that data may be inputted to all of the banks, in response to the first latch signal LATCH03, the second latch signal LATCH47, and the align signal ALIGN, which may be generated by the control unit 250.

The control unit 250 of the semiconductor memory apparatus 200 according to an embodiment will be described in more detail with reference to FIGS. 3 to 7.

FIGS. 3 to 7 are diagrams illustrating the configuration of the control unit of the semiconductor memory apparatus according to an embodiment.

Figure 3:
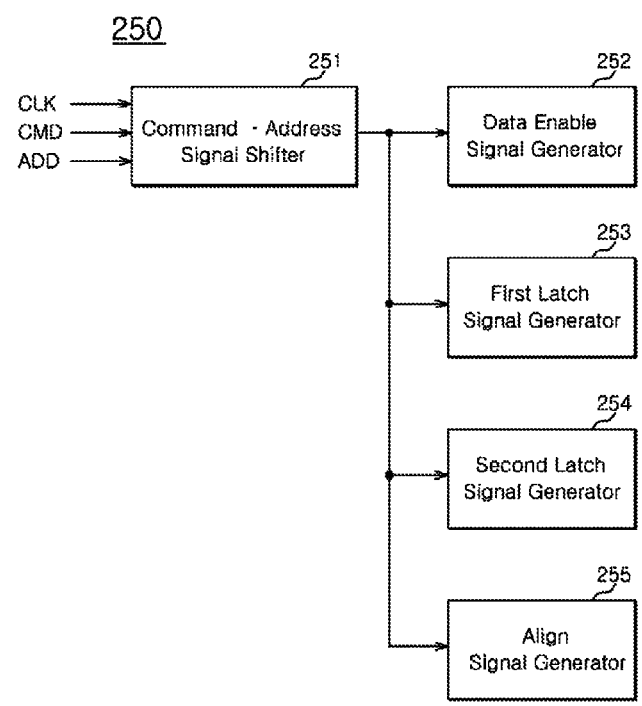
FIG. 3 is a diagram illustrating the configuration of a control unit of the semiconductor memory apparatus according to an embodiment.

Referring to FIG. 3, the control unit 250 of the semiconductor memory apparatus 200 according to an embodiment may include a command address signal shifter 251, a data enable signal generator 252, a first latch signal generator 253, a second latch signal generator 254, and an align signal generator 255.

Figure 4:
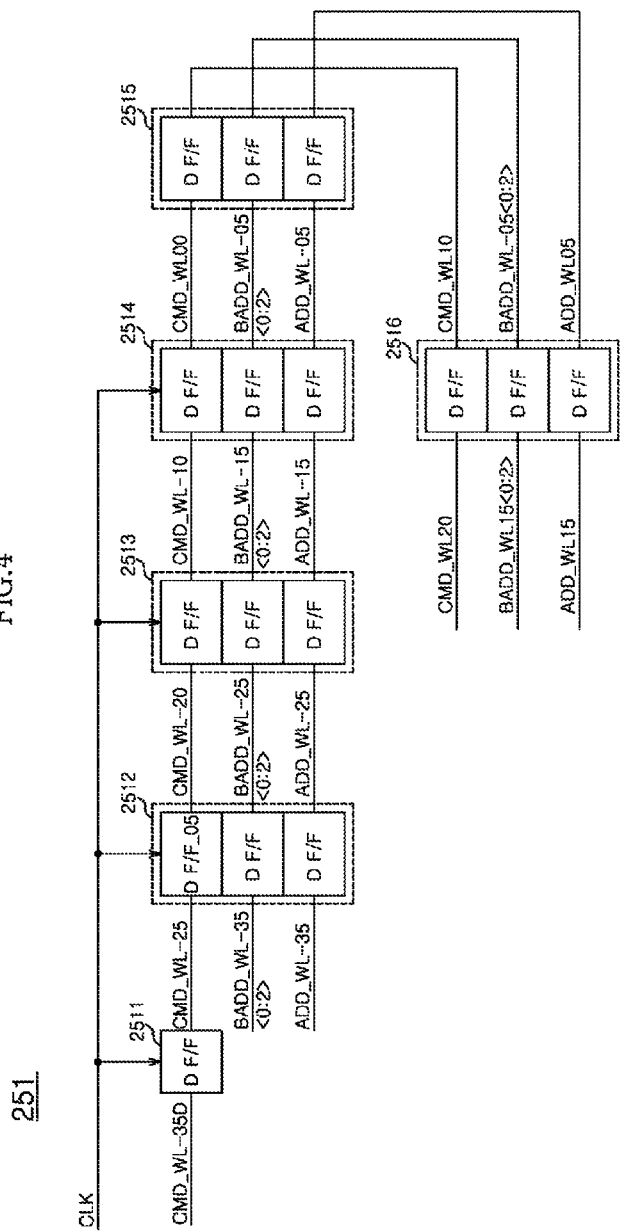
FIG. 4 is a diagram illustrating the configuration of a command address shifter of FIG. 3.

The command address signal shifter 251 may be configured to receive the command signal CMD and the address signal ADD from the memory control apparatus 100 and shifts the received signals in synchronization with the same clock signal CLK. Referring to FIG. 4, the command address signal shifter 251 may include a plurality of D flip-flops 2511 to 2516. Here, the command address signal shifter 251 shifts a command signal CMD and an address signal ADD may be outputted at substantially the same time and may be outputted from D flip-flops positioned at the same column such that the command signal CMD and the address signal ADD have a margin of about 0.5 clock. ///The operation of the fourth D flip-flop 2514 may be taken as an example. In this case, it can be seen that a command signal CMD_WL-00 and an address signal ADD_WL-05 may be outputted at substantially the same time and positioned at the same column have a margin of about 0.5 clock. Here, BAD-D_WL-05<0:2> refers to a bank address signal. The control unit 250 according to an embodiment generates the data enable signal ENDIO, the first latch signal LATCH03, the second latch signal LATCH47, and the align signal ALIGN, using the command signal CMD and the address ADD having a margin of about 0.5 clock.

Figure 5:
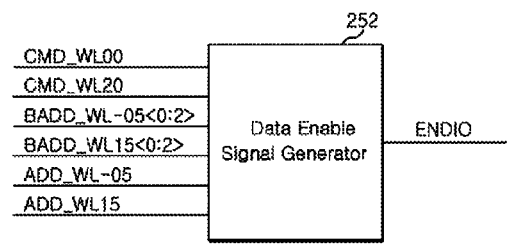
FIG. 5 is a diagram illustrating the configuration of a data enable signal generator of FIG. 3.

The data enable signal generator 252 may be configured to generate the data enable signal ENDIO using the command signal CMD, a bank address signal BADD, and an address signal ADD which are generated at the same column. The bank address signal BADD and the address signal ADD contain bank address information. Referring to FIG. 5, the data enable signal generator 252 generates the data enable signal ENDIO using a command signal CMD_WL00, a bank address signal BADD_WL-05<0:2>, an address signal ADD_WL-05, a command signal CMD_WL20, a bank address signal BADD_WL-16<0:2>, and an address signal ADD_WL-15. The command signal CMD_WL00 may be outputted from the fourth D flip-flop 2514, the bank address signal BADD_WL-05<0:2>and the address signal ADD_WL-05 may be outputted from the fourth D flip-flop 2514 at substantially the same time, the command signal CMD_WL20 may be outputted from the sixth D flip-flop 2516 about two clocks (i.e. about two predetermined lengths of time or time periods) after the signals may be outputted from the fourth D flip-flop 2514, and the bank address signal BADD_WL-16<0:2> and the address signal ADD_WL-15 may be outputted from the sixth D flip-flop 2516 at substantially the same time. The data enable signal generator 252 applies a different combination of the signals depending on a burst length. For example, when the burst length is eight, the data enable signal generator 252 generates the data enable signal ENDIO using the command signal CMD_WL00 outputted from the fourth D flip-flop 2514 and the command signal CMD_WL20 outputted from the sixth D flip-flop 2516. However, when the burst length is four, the data enable signal generator 252 generates the data enable signal ENDIO using the command signal CMD_WL00 outputted from the fourth D flip-flop 2514.

Figure 6:
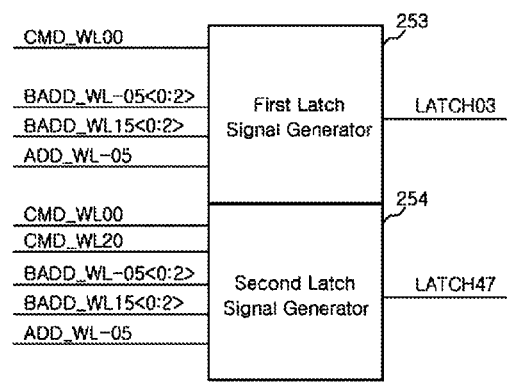
FIG. 6 is a diagram illustrating the configuration of first and second latch signal generators of FIG. 3.

The first latch signal generator 253 may be configured to generate the first latch signal LATCH03 to latch a data signal Data to be inputted to the octet banks OBK00 to OBK03 of the first group, among the eight octet banks. Like the data enable signal generator 252, the first latch signal generator 253 generates the first latch signal LATCH03 using a command signal CMD, a bank address signal BADD, and an address signal ADD which are generated from the same column. The band address signal BADD and the address signal ADD contain bank address information. Referring to FIG. 6, when the burst length is eight, the first latch signal generator 253 unconditionally generates the first latch signal LATCH03 using a command signal, a bank address signal, and an address signal which may be outputted by a first clock signal. That is, the first latch signal generator 253 generates the first latch signal LATCH03 using the command signal CMD_WL00, the bank address signal BADD_WL-05<0:2>, and the address signal ADD_WL-05, which may be outputted from the fourth D flip-flop 2514. Meanwhile, when the burst length is four, the first latch signal generator 253 generates the first latch signal LATCH03 only in case where data are inputted to the octet banks OBK00 to OBK03 of the first group according to the second address value.

The second latch signal generator 254 may be configured to generate the second latch signal LATCH47 for latching a data signal Data to be inputted to the octet banks OBK04 to OBK07 of the second group, among eight octet banks. Like the data enable signal generator 252, the second latch signal generator 254 generates the second latch signal LATCH47 using a command signal CMD, a bank address signal BADD, and an address signal ADD which are generated from the same column. The bank address signal BADD and the address signal ADD contain bank address information. Referring to FIG. 6, since the second latch signal generator 252 should generate the second latch signal LATCH47 at first and second clocks regardless of the burst length, the second latch signal generator 254 generates the second latch signal LATCH47 using the command signal CMD_WL00, the bank address signal BADD_WL05<0:2>, and the address signal ADD_WL-05, which may be outputted from the fourth D flip-flop 2514, and the command signal CMD_WL20, the bank address signal BADD_WL15<0:2>, and the address signal ADD_WL15, which may be outputted from the sixth D flip-flop 2516.

Figure 7:
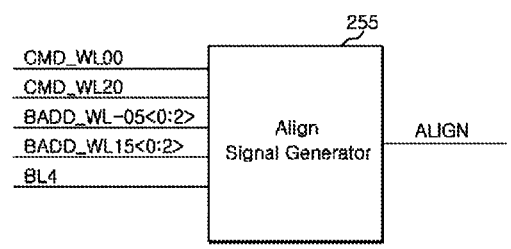
FIG. 7 is a diagram illustrating the configuration of an align signal generator of FIG. 3.

The align signal generator 255 may be configured to generate the align signal ALIGN for controlling the data signals Data to be inputted to the respective octet banks OBK00 to OBK07 of the memory cell area 210 at substantially the same time. When the burst length is four, the align signal generator 255 generates the align signal ALIGN using the command signal and the bank address signal which may be outputted by the first clock signal, and when the burst length is eight, the align signal generator 255 generates the align signal ALIGN using the command signal and the bank address signal which may be outputted by the second clock signal. Referring to FIG. 7, the align signal generator 255 generates the align signal ALIGN according to the command signal CMD_WL00 and the bank address signal BADD_WL-05<0:2> which may be outputted from the fourth D flip-flop 2514, the command signal CMD_WL20 and the address signal BADD_WL15<0:2>which may be outputted from the sixth D flop-flop 2516, and the burst length of four.

The operation of the semiconductor memory apparatus 200 according to an embodiment will be described with reference to FIGS. 8 and 9.

Figure 8:
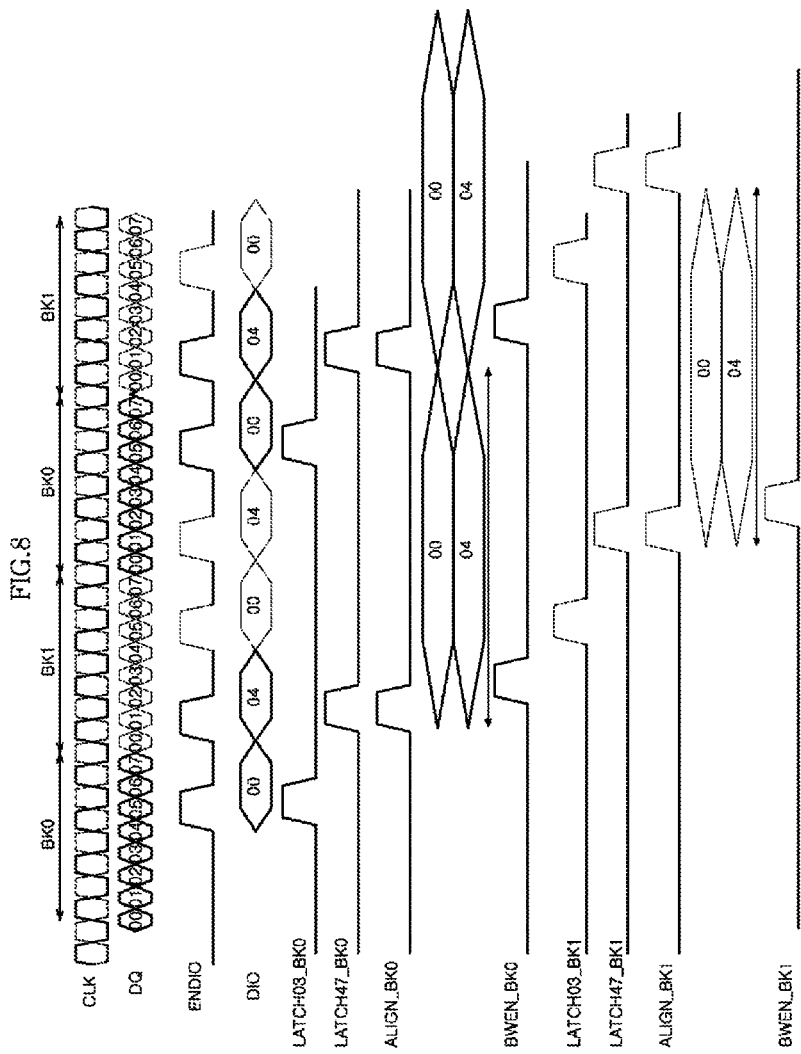
FIG. 8 is a diagram illustrating the operation of the semiconductor memory apparatus according to an embodiment, when a burst length is eight.

FIG. 8 is a diagram illustrating the operation of the semiconductor memory apparatus according to an embodiment, when the burst length is eight.

Referring to FIG. 8, the control unit 250 of the semiconductor memory apparatus 200 according to an embodiment generates the first latch signal LATCH03, the second latch signal LATCH47, and the align signal ALIGN for each of the banks BK0 and BK1. FIG. 8 illustrates a case in which the burst length is eight.

First, the first bank BK0 receives a data signal Data corresponding to the octet banks OBK00 to OBK03 of the first group according to the first latch signal LATCH03_BK0. At this time, the first latch signal LATCH03_BK0 of the first bank BK0 is generated at substantially the same time when a first pulse of the data enable signal ENDIO is generated. The first latch signal LATCH03_BK0 is generated using a command signal CMD and an address signal ADD which are synchronized with the same clock.

After about two clocks (i.e. about two predetermined lengths of time or time periods), the first bank BK0 receives data signals Data corresponding to the octet banks OBK04 to OBK07 of the second group according to the second latch signal LATCH47_BK0. At this time, the second latch signal LATCH_BK0 of the first bank BK0 is generated at substantially the same time when a second pulse of the data enable signal ENDIO is generated. The second latch signal LATCH_BK0 is generated using a command signal CMD and an address signal which are synchronized with the same clock.

As such, the first and second latch signals LATCH03_BK0 and LATCH47_BK0 of the first bank BK0 are generated to have a margin of about two clocks (i.e. about two predetermined lengths of time or time periods). Here, the align signal ALIGN_BK0 of the first bank BK0 is also generated at substantially the same time when the second pulse of the data enable signal ENDIO is generated. The align signal ALIGN_BK0 is also generated using a command signal CMD and an address signal ADD which are synchronized with the same clock. The data latch align unit 260 aligns the data signals Data according to the align signal ALIGN_BK0, and a write driver (not illustrated) inputs the data to the corresponding cells of the first bank BK0 according to a bank write enable signal BWEN_BK0. Then, as the minimum data margin (for example, four clocks) of the data input/output line DIO is secured, a margin of the bank write enable signal BWEN is directly secured.

Furthermore, the second bank BK1 receives data signals Data corresponding to the octet banks OBK10 to OBK13 of the first group according to the first latch signal LATCH03_BK1. At this time, the first latch signal LATCH03_BK1 of the second bank BK1 is generated at substantially the same time when a third pulse of the data enable signal ENDIO is generated. The first latch signal LATCH03_BK1 is generated using a command signal CMD and an address signal ADD which are synchronized with the same clock.

As such, about two clocks (i.e. about two predetermined lengths of time or time periods) after the first latch signal LATCH03_BK1 is generated, the second bank BK receives data signals Data corresponding to the octet banks OBK14 to OBK17 of the second group according to the second latch signal LATCH47_BK1. At this time, the second latch signal LATCH47_BK1 of the second bank BK1 is generated at the same time when a fourth pulse signal of the data enable signal ENDIO is generated. The second latch signal LATCH47_BK1 is generated using a command signal CMD and an address signal ADD which are synchronized with the same clock.

As such, the first and second latch signals LATCH03_BK1 and LATCH47_BK1 of the second bank BK1 are generated to have a margin of two clocks (i.e. about two predetermined lengths of time or time periods). Here, the align signal ALIGN_BK1 of the second bank BK1 is also generated at substantially the same time when the fourth pulse of the data enable signal ENDIO is generated. The align signal ALIGN_BK1 is also generated using the command signal CMD and the address signal ADD which are synchronized with the same clock. The data latch align unit 260 aligns the data signals according to the align signal ALIGN_BK1 generated in such a manner, and the write driver (not illustrated) then inputs data to the corresponding cells of the second bank BK1 according to the bank write enable signal BWEN_BK1.

Figure 9:
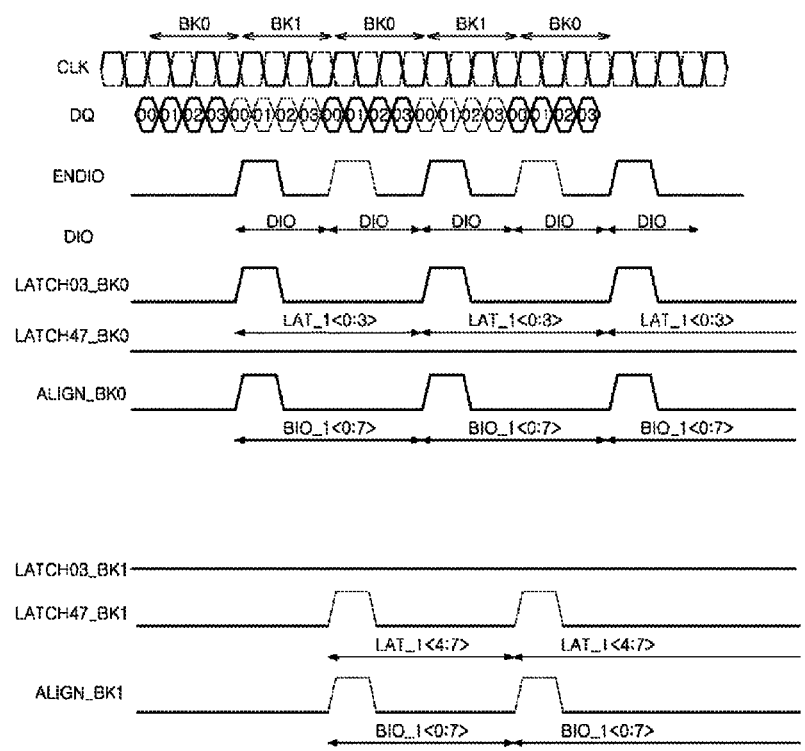
FIG. 9 is a diagram illustrating the operation of the semiconductor memory apparatus according to an embodiment, when the burst length is four.

FIG. 9 is a diagram illustrating the operation of the semiconductor memory apparatus according to an embodiment, when the burst length is four.

As described above with reference to FIG. 6, the semiconductor memory apparatus 200 according to an embodiment may generate only the first latch signal LATCH03 depending on the level of the second address, when the burst length is four. In FIG. 9, suppose that the first bank BK0 has a low level and the second bank BK1 has a high level. Then, as illustrated in FIG. 9, the first bank BK0 accesses only the octet banks OBK00 to OBK03, and the second bank BK1 accesses only the octet banks OBK14 to OBK17.

First, the first bank BK0 generates only the first latch signal LATCH03_BK0 of the first bank and receives the data signals Data corresponding to the octet banks OBK00 to OBK03 of the first group. At this time, the first latch signal LATCH03_BK0 of the first bank BK0 are generated at substantially the same time when the first pulse of the data enable signal ENDIO is generated. The first latch signal LATCH03_BK0 is generated using a command signal CMD and an address signal ADD which are synchronized with the same clock. Here, when a first pulse of the data enable signal ENDIO is generated, the align signal ALIGN_BK0 is also generated. That is, the align signal ALIGN_BK0 is generated using the command signal CMD and the address signal ADD which may be outputted at a first clock. The data latch align unit 260 aligns the data signals according to the align signal ALIGN_BK0 generated in such a manner, and the write driver (not illustrated) inputs the data to corresponding cells of the first bank BK0 according to the bank write enable signal BWEN.

After about two clocks (i.e. about two predetermined lengths of time or time periods), the second bank BK1 receives the data signals Data corresponding to the octet banks OBK14 to OBK17 of the second group according to the second latch signal LATCH47_BK1. At this time, the second latch signal LATCH47_BK1 of the second bank BK1 is generated at substantially the same time when a second pulse of the data enable signal ENDIO is generated. The second latch signal LATCH47_BK1 is generated using a command signal CMD and an address signal ADD which are synchronized with the same clock. Here, when the second pulse of the data enable signal ENDIO is generated, the align signal ALIGN_BK1 of the second bank BK1 is also generated. The data latch align unit 260 aligns the data signals according to the align signal ALIGN_BK1 generated in such a manner, and the write driver inputs the data to corresponding cells of the second bank BK1 according to the bank write enable signal BWEN.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor integrated circuit comprising:
   a memory control apparatus configured to receive a data signal, a command signal, and an address signal from outside and control the data signal to be inputted or outputted; and
   a semiconductor memory apparatus configured to receive the data signal, the command signal, and the address signal from the memory control apparatus, shift the command signal and the address signal to have a predetermined margin in synchronization with the same clock, generate a plurality of control signals using the shifted command signal and address signal, and input the data signal to a corresponding bank of a plurality of banks according to control of the generated control signals,
   wherein the semiconductor memory apparatus includes:
   a command address signal shifter configured to shift the command signal and the address signal to have the predetermined margin between the command signal and the address signal, and to output a plurality of shifting signals;

a data enable signal generator configured to generate a data enable signal having a predetermined margin, using the plurality of shifting signals;

a latch signal generator configured to generate a latch signal for latching data signals inputted to a first bank group and a second bank group, respectively, using the plurality of shifting signals; and an align signal generator configured to generate an align signal for aligning the data signals inputted to the first and second bank groups, using the plurality of shifting signals.

2. The semiconductor integrated circuit according to claim 1, wherein the semiconductor memory apparatus comprises:

a memory cell area comprising the plurality of banks;

a control unit configured to include the command address signal shifter, the data enable signal generator, the latch signal generator and the align signal generator; and a data latch align unit configured to latch and align the data signal according to the control signals outputted from the control unit.

3. The semiconductor integrated circuit according to claim 2, wherein the command signal and the address signal are outputted in synchronization with the same clock, and the control unit generates the plurality of control signals at substantially the same time.

4. The semiconductor integrated circuit according to claim 2, wherein each of the banks of the memory cell area comprises a plurality of octet banks, which are sequentially arranged, the plurality of octet banks are divided into the first and second bank groups according to the arrangement order, and the octet banks of the first bank group and the octet banks of the second bank group respectively form a pair.

5. The semiconductor integrated circuit according to claim 3, wherein the command address signal shifter is configured to output a first command signal, a first address signal, a second command signal and a second address signal, as the plurality of shifting signals, wherein the first command signal and the first address signal are outputted from a first output node of the command address signal shifter, and the second command signal and the second address signal are outputted from a second output node of the command address signal shifter.

6. The semiconductor integrated circuit according to claim 5, wherein the command address signal shifter comprises a plurality of D flip-flops.

7. The semiconductor integrated circuit according to claim 5, wherein the command address signal shifter comprises a plurality of D flip-flops which are arranged in a column direction to output command signals and address signals having a predetermined margin in synchronization with the same clock, and the first command signal and the first address signal, outputted from the same column, have a margin of about 0.5 clock.

8. The semiconductor integrated circuit according to claim 1, wherein the data enable signal generator generates the data enable signal to have a margin of about two clocks.

9. The semiconductor integrated circuit according to claim 4, wherein the latch signal generator includes:

a first latch signal generator configured to generate a first latch signal for latching a data signal inputted to the octet banks of the first bank group, using a first command signal, a first address signal, a second command signal, and a second address signal, as the plurality of shifting signals; and a second latch signal generator configured to generate a second latch signal for latching a data signal inputted to the octet banks of the second bank group.

10. The semiconductor integrated circuit according to claim 9, wherein the first latch signal generator generates the first latch signal at a different generation period depending on a burst length.

11. The semiconductor integrated circuit according to claim 9, wherein the second latch signal generator determines whether or not to generate the second latch signal according to a burst length and the level of the second address signal.

12. The semiconductor integrated circuit according to claim 1, wherein the align signal generator generates the align signal at a different generation period depending on a burst length, using a first command signal, a first address signal, a second command signal, and a second address signal, as the plurality of shifting signals.

* * * * *